United States Patent
Straznicky et al.

(10) Patent No.: US 9,526,191 B2
(45) Date of Patent: Dec. 20, 2016

(54) FLUID COOLED ENCLOSURE FOR CIRCUIT MODULE APPARATUS AND METHODS OF COOLING A CONDUCTION COOLED CIRCUIT MODULE

(71) Applicant: DY 4 Systems, Inc., Kanata (CA)

(72) Inventors: Ivan Straznicky, Carleton Place (CA); William Edward Ratliff, Acton, CA (US)

(73) Assignee: DY 4 SYSTEMS INC., Kanata (CA)

( * ) Notice: Subject to any disclaimer, the term of this patent is extended or adjusted under 35 U.S.C. 154(b) by 130 days.

(21) Appl. No.: 14/245,570

(22) Filed: Apr. 4, 2014

(65) Prior Publication Data
US 2014/0340845 A1  Nov. 20, 2014

Related U.S. Application Data

(60) Provisional application No. 61/823,615, filed on May 15, 2013.

(51) Int. Cl.
H05K 7/20 (2006.01)

(52) U.S. Cl.
CPC ............ *H05K 7/20* (2013.01); *H05K 7/20145* (2013.01); *H05K 7/20563* (2013.01)

(58) Field of Classification Search
CPC ......... G06F 1/20; H05K 7/20; H05K 7/20563; H05K 7/20145
(Continued)

(56) References Cited

U.S. PATENT DOCUMENTS 4,574,872 A * 3/1986 Yano ..................... F24F 3/147
                                                              165/10
4,765,397 A * 8/1988 Chrysler ............... H01L 23/473
                                                              165/104.33
(Continued)

FOREIGN PATENT DOCUMENTS

EP   1 965 619 A1   9/2008
EP   2 337 437 A2   6/2011
(Continued)

OTHER PUBLICATIONS

Extended European Search Report for Corresponding Application No. EP 14 16 8198.1; Dated May 6, 2015.
(Continued)

*Primary Examiner* — Courtney Smith
*Assistant Examiner* — Matt Dhillon
(74) *Attorney, Agent, or Firm* — Pearne & Gordon LLP

(57) ABSTRACT

A fluid cooled enclosure includes a fluid conduit that provides a fluid coolant path between sides of a housing. Optionally, the fluid conduit can provide bi-directional fluid coolant paths. In another example, an interface block can be provided with a first interface surface engaging an interface surface of a first end portion of the fluid conduit. In another example, a first end portion of the fluid conduit is fabricated with a first material composition and the interface block is fabricated with a second material composition that has a higher thermal conductivity than the first material composition. In further examples, methods of cooling a conduction cooled circuit module comprise the steps of mounting an interface block to a conduction cooled circuit module, mounting the interface block with respect to the fluid conduit, and cooling the electrical circuits of the conduction cooled circuit module by flowing fluid coolant through the fluid conduit.

17 Claims, 9 Drawing Sheets

(58) Field of Classification Search
USPC .............. 361/679.47, 679.54, 688, 691, 695; 165/104.26
See application file for complete search history.

(56) References Cited

U.S. PATENT DOCUMENTS

| | | | | |
|---|---|---|---|---|
| 4,851,965 | A * | 7/1989 | Gabuzda | H05K 7/20154 165/908 |
| 5,099,910 | A * | 3/1992 | Walpole | F28F 3/12 165/170 |
| 5,136,464 | A * | 8/1992 | Ohmori | H05K 7/20572 361/694 |
| 5,361,188 | A * | 11/1994 | Kondou | H01L 23/467 165/104.34 |
| 5,544,012 | A * | 8/1996 | Koike | H05K 7/20572 165/122 |
| 5,977,785 | A * | 11/1999 | Burward-Hoy | F28D 9/0093 165/201 |
| 6,301,109 | B1 * | 10/2001 | Chu | F28F 3/12 165/165 |
| 6,430,042 | B1 * | 8/2002 | Ohashi | G06F 1/203 165/104.33 |
| 6,446,442 | B1 * | 9/2002 | Batchelor | F25B 21/02 62/259.2 |
| 6,765,798 | B1 * | 7/2004 | Ratliff | H05K 7/20445 165/185 |
| 6,778,393 | B2 * | 8/2004 | Messina | H01L 23/4338 165/80.4 |
| 6,986,382 | B2 * | 1/2006 | Upadhya | F04B 19/006 165/104.21 |
| 6,988,534 | B2 * | 1/2006 | Kenny | F04B 17/00 165/104.21 |
| 7,180,737 | B2 * | 2/2007 | Straub, Jr. | H05K 7/20563 165/122 |
| 7,187,549 | B2 * | 3/2007 | Teneketges | H01L 23/473 165/104.33 |
| 7,324,336 | B2 | 1/2008 | Vos et al. | |
| 7,411,787 | B2 * | 8/2008 | Katakura | G11B 33/14 361/695 |
| 7,508,664 | B2 * | 3/2009 | Holland | H05K 7/20581 165/104.33 |
| 7,679,917 | B2 | 3/2010 | Deck et al. | |
| 7,995,346 | B2 | 8/2011 | Biemer et al. | |
| 8,157,001 | B2 * | 4/2012 | Hom | G06F 1/20 165/165 |
| 8,495,884 | B2 * | 7/2013 | Bell | F02G 1/043 62/3.2 |
| 8,964,384 | B2 * | 2/2015 | Leigh | H01L 23/4006 361/689 |
| 2004/0068991 | A1 * | 4/2004 | Banney | F28F 1/045 62/3.7 |
| 2006/0114013 | A1 * | 6/2006 | Kabbani | H01L 23/473 324/750.09 |
| 2010/0079940 | A1 | 4/2010 | Mongia et al. | |
| 2011/0094500 | A1 * | 4/2011 | Hulen | E01C 11/26 126/609 |
| 2013/0100610 | A1 * | 4/2013 | Schneider | H05K 7/20572 361/690 |
| 2014/0098493 | A1 * | 4/2014 | Chen | H05K 7/20127 361/692 |

FOREIGN PATENT DOCUMENTS

| | | |
|---|---|---|
| WO | 97/01264 A1 | 1/1997 |
| WO | 2008/098494 A1 | 8/2008 |
| WO | 2013/060281 A1 | 5/2013 |

OTHER PUBLICATIONS

Office Action from Corresponding Application No. EP 14168198.1 (Communication Pursuant to Article 94(3) EPC); Dated Oct. 5, 2016.

* cited by examiner

FLUID COOLED ENCLOSURE FOR CIRCUIT MODULE APPARATUS AND METHODS OF COOLING A CONDUCTION COOLED CIRCUIT MODULE

CROSS-REFERENCE TO RELATED APPLICATIONS

This application claims the benefit of U.S. Provisional Application No. 61/823,615, filed May 15, 2013, the entire disclosure of which is hereby incorporated herein by reference.

FIELD

The present disclosure relates generally to fluid cooled enclosure and methods of cooling conduction cooled circuit module and, more particularly, to fluid cooled enclosure for supporting conduction cooled circuit modules of a circuit module apparatus and methods of cooling conduction cooled circuit module with a fluid cooled enclosure.

BACKGROUND

It is known to provide cooling assemblies to mount and cool a plurality of conduction cooled circuit modules. Cooling assemblies may provide fluid passages to help transfer heat away from the conduction cooled circuit modules. There is a desire to provide fluid cooled enclosure that can accommodate a wide range of applications with different conduction cooled circuit module arrangements. There is a further desire to provide fluid cooled enclosure with enhanced heat transfer capabilities. There is a further desire to provide fluid cooled enclosure that allows fabrication of fluid conduits at a reduced cost and weight.

SUMMARY

In one aspect, a fluid cooled enclosure for a circuit module apparatus comprises a housing with a first side and a second side. The fluid cooled enclosure further includes a fluid conduit including a first end portion positioned at the first side of the housing and a second end portion positioned at the second side of the housing. The fluid conduit provides a fluid coolant path between the first side and the second side of the housing. The fluid cooled enclosure further includes an interface block configured to be mounted with respect to the housing such that a first interface surface of the interface block engages an interface surface of the first end portion of the fluid conduit.

In one example of the first aspect, the interface block includes a second interface surface configured to interface with a surface of a conduction member of a conduction cooled circuit module. In one example, the first interface surface and the second interface surface of the interface block face away from one another. For instance, the first interface surface can be substantially parallel to the second interface surface of the interface block.

In another example of the first aspect, the first end portion of the fluid conduit is fabricated with a first material composition and the interface block is fabricated with a second material composition that has a higher thermal conductivity than the first material composition.

In still another example of the first aspect, the fluid conduit comprises an extruded fluid conduit with a substantially constant cross sectional extruded shape.

In yet another example of the first aspect, the fluid conduit is configured for bi-directional cooling wherein the first end portion of the fluid conduit includes a first inlet port for a first fluid coolant and the second end portion of the fluid conduit includes a second inlet port for a second fluid coolant. In a further example, the first end portion of the fluid conduit includes a second outlet port for the second fluid coolant and the second end portion of the fluid conduit includes a first outlet for the first fluid coolant.

In still another example of the first aspect, the fluid conduit includes a first fluid conduit for a first fluid coolant and a second fluid conduit for the second fluid coolant. In one example, the first fluid conduit is nested with the second fluid conduit.

In another example of the first aspect, the enclosure further comprises a biasing member configured to bias a portion of a conduction member of a conduction cooled circuit module against the interface block. Once biased, the interface block is compressed between the first end portion of the fluid conduit and the portion of the conduction member of the conduction cooled circuit module.

In still another example of the first aspect, the interface block is integral with a conduction member of a conduction cooled circuit module.

The first aspect may be provided alone or with any one or combination of the examples of the first aspect discussed above.

In accordance with a second aspect, a fluid cooled enclosure for a circuit module apparatus comprises a housing with a first side and a second side. The enclosure further includes a fluid conduit including a first end portion positioned at the first side of the housing and a second end portion positioned at the second side of the housing. The fluid conduit provides a fluid coolant path between the first side and the second side of the housing. The enclosure further includes an interface block configured to be mounted with respect to the first end portion of the fluid conduit. The first end portion of the fluid conduit is fabricated with a first material composition and the interface block is fabricated with a second material composition that has a higher thermal conductivity than the first material composition.

In accordance with a third aspect, a fluid cooled enclosure for a circuit module apparatus comprises a housing with a first side and a second side. The enclosure includes a fluid conduit configured for bi-directional cooling, wherein the fluid conduit includes a first end portion positioned at the first side of the housing and a second end portion positioned at the second side of the housing. The fluid conduit provides bi-directional fluid coolant paths between the first side and the second side of the housing.

In one example of the third aspect, the first end portion of the fluid conduit includes a first inlet port for a first fluid coolant and the second end portion of the fluid conduit includes a second inlet port for a second fluid coolant. For example, the second end portion of the fluid conduit can further include a first outlet for the first fluid coolant and the first end portion of the fluid conduit can further include a second outlet port for the second fluid coolant.

In another example of the third aspect, the fluid conduit can include a first fluid conduit for a first fluid coolant and a second fluid conduit for the second fluid coolant. For example, the first fluid conduit may be nested with the second fluid conduit.

The third aspect may be provided alone or with any one or combination of the examples of the third aspect discussed above.

In accordance with a fourth aspect, a method of cooling a conduction cooled circuit module comprises the step (I) of providing a fluid cooled enclosure with a fluid conduit and the step (II) of mounting an interface block to the conduction cooled circuit module such that a portion of a conduction member of the conduction cooled circuit module engages an interface surface of the interface block. The method further includes the step (III) of mounting the interface block with respect to the fluid conduit such that another interface surface of the interface block engages an interface surface of the fluid conduit. The method also includes the step (IV) of cooling electrical circuits of the conduction cooled circuit module by flowing fluid coolant through the fluid conduit, wherein heat is transferred from the electrical circuits, through the conduction member, through the interface block and carried away by the fluid coolant.

In one example of the fourth aspect, the method further includes the step of selecting an interface block including a desired heat transfer characteristic for mounting during step (II).

In another example of the fourth aspect, step (II) occurs before step (III).

The fourth aspect may be provided alone or with any one or combination of the examples of the fourth aspect discussed above.

BRIEF DESCRIPTION OF THE DRAWINGS

These and other features, aspects and advantages of the claimed invention are better understood when the following detailed description is read with reference to the accompanying drawings, in which:

DETAILED DESCRIPTION

Figure 1:
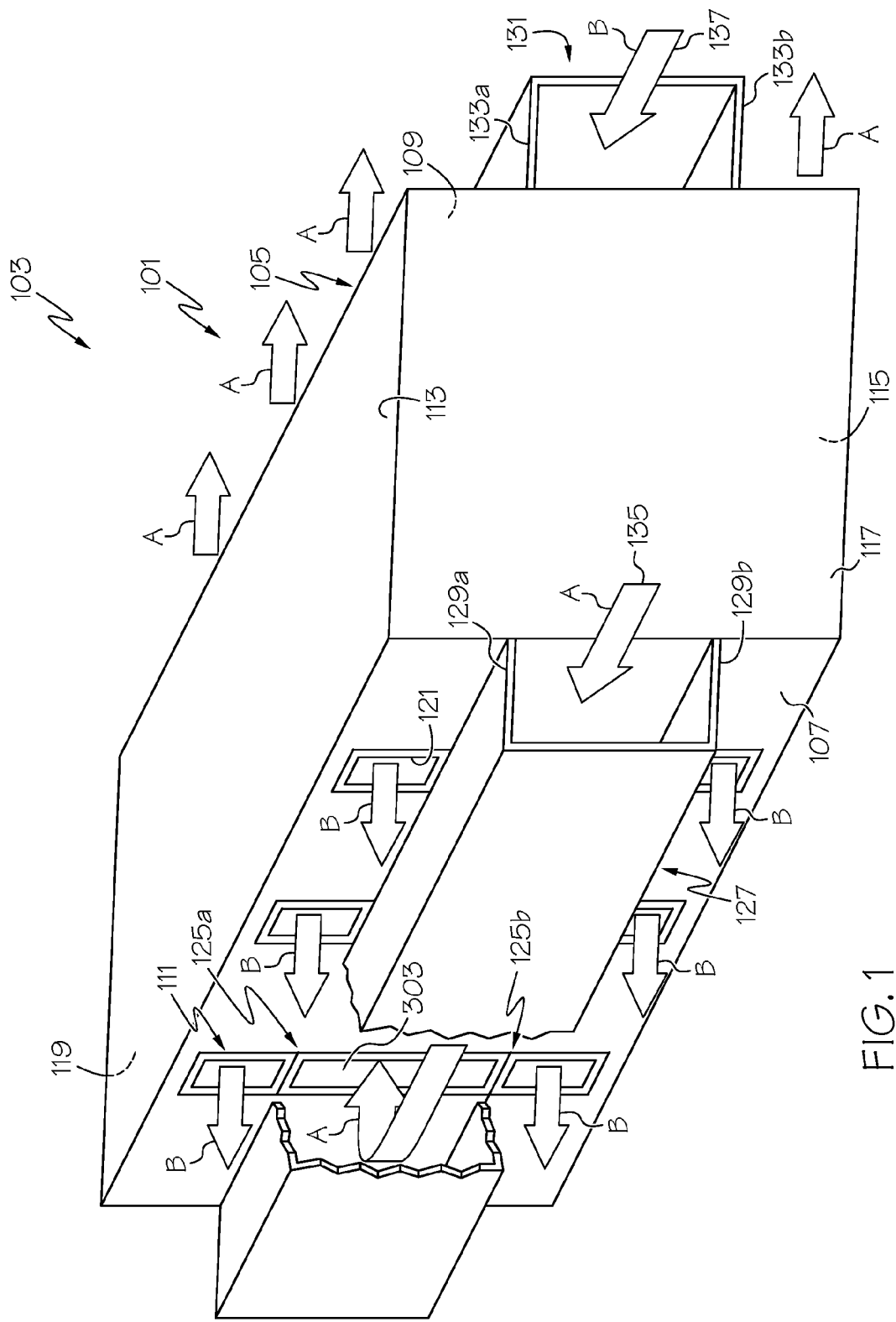
FIG. 1 is a perspective view of one example circuit module apparatus.

Aspects of the claimed invention will now be described more fully hereinafter with reference to the accompanying drawings in which example embodiments of the claimed invention are shown. Whenever possible, the same reference numerals are used throughout the drawings to refer to the same or like parts. However, the claimed invention may be embodied in many different forms and should not be construed as limited to the embodiments set forth herein. These example embodiments are provided so that this disclosure will be both thorough and complete, and will fully convey the scope of the claimed invention to those skilled in the art.

As will be described below, fluid cooled enclosure may be provided that may simultaneously support and cool one or more conduction cooled circuit modules. As such, a plurality of circuit modules of relatively high power can be supported together in a relatively compact arrangement while providing sufficient cooling of the conduction cooled circuit modules to prevent overheating that might otherwise occur without sufficient cooling.

FIG. 1 illustrates just one example of a fluid cooled enclosure 101 for a circuit module apparatus 103. The fluid cooled enclosure 101 includes a housing 105 that may facilitate support of the circuit modules while protecting the circuit modules from damage and/or contamination from environmental conditions. As shown, the housing 105 can comprise a first side 107 comprising a first lateral side and a second side 109 comprising a second lateral side. Although not shown, the first and second sides can be selected from any combination of the first lateral side 107, the second lateral side 109, a top side 113, a bottom side 115, a front side 117 and a rear side 119. As such, the first and second side can comprise opposite sides comprising the first and second lateral sides 107, 109; the top and bottom sides 113, 115; or the front and rear sides 117, 119. Also, the first and second sides can comprise any combination of adjacent sides of the housing 105. The housing 105 is shown as a box-like configuration with six total sides although other housing configurations may have more or less than six sides in further examples. Moreover, although the sides of the housing are illustrated as substantially planar sides, further shapes may be provided in further examples. For instance, the housing may comprise a cylindrical housing where the sides may comprise any combination of a front end, a rear end, one of the cylindrical lateral sides, the cylindrical top or the cylindrical bottom of the cylindrical housing.

The fluid cooled enclosure 101 further includes a plurality of fluid conduits 111 although a single fluid conduit may be provided in further examples. Fluid conduits may be designed to accommodate various fluid coolants such as liquid or gas fluid coolants. In one example, the fluid conduit may accommodate air being passed through the fluid conduit to cool the system. In further examples, liquid may be used to enhance heat transfer from the conduction cooled circuit module when compared to air cooled systems.

Figure 2:
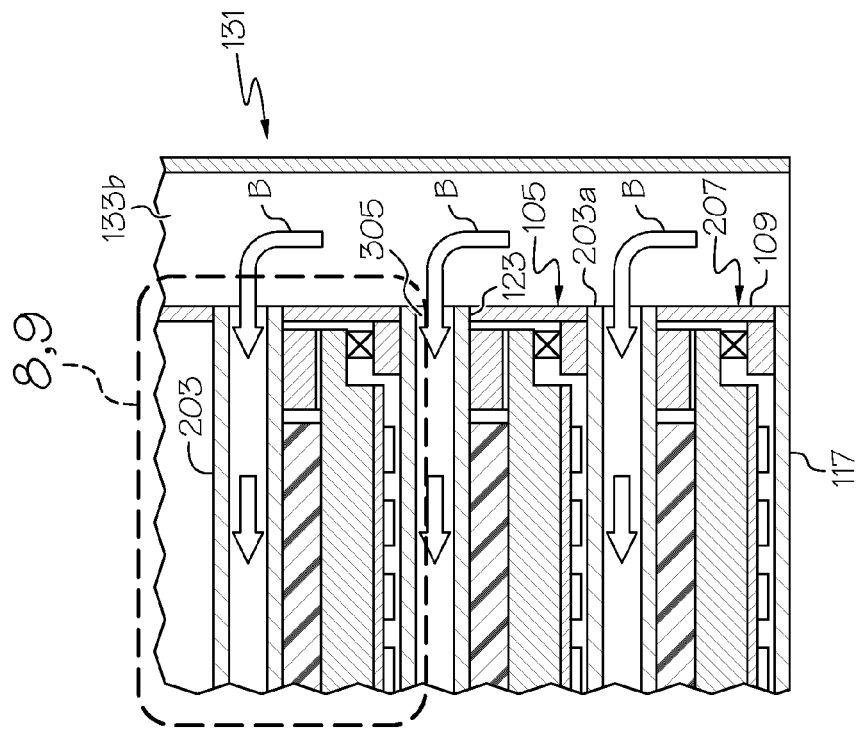
FIG. 2 is a partial schematic cross section of the circuit module apparatus along line 2-2 of FIG. 1.
Figure 2:
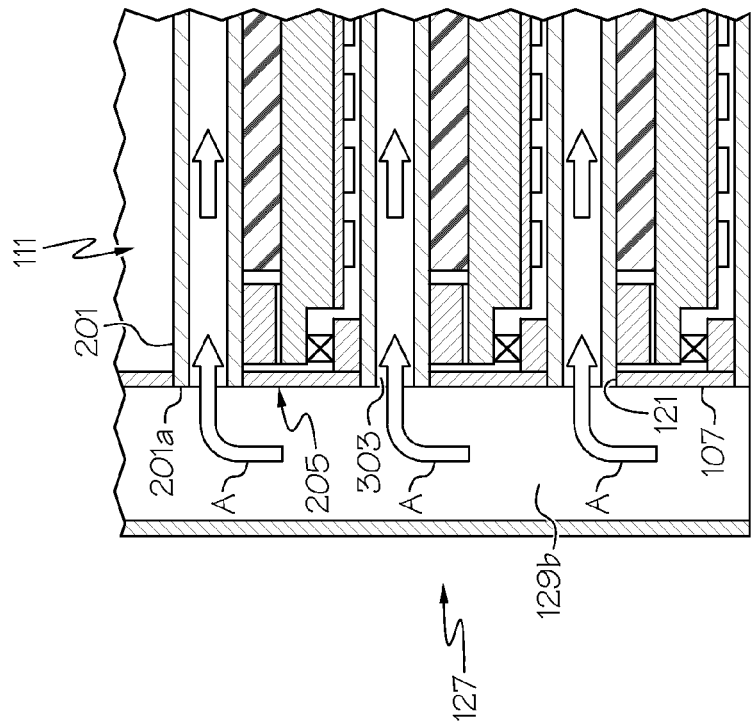

As shown, each fluid conduit 111 is substantially identical with one another although fluid conduits may have different configurations in further examples. As shown in FIG. 2, the fluid conduit 111 can include a first end portion 201 positioned at the first side comprising the first lateral side 107 of the housing 105 and a second end portion 203 positioned at the second side comprising the second lateral side 109 of the housing 105.

Figure 3:
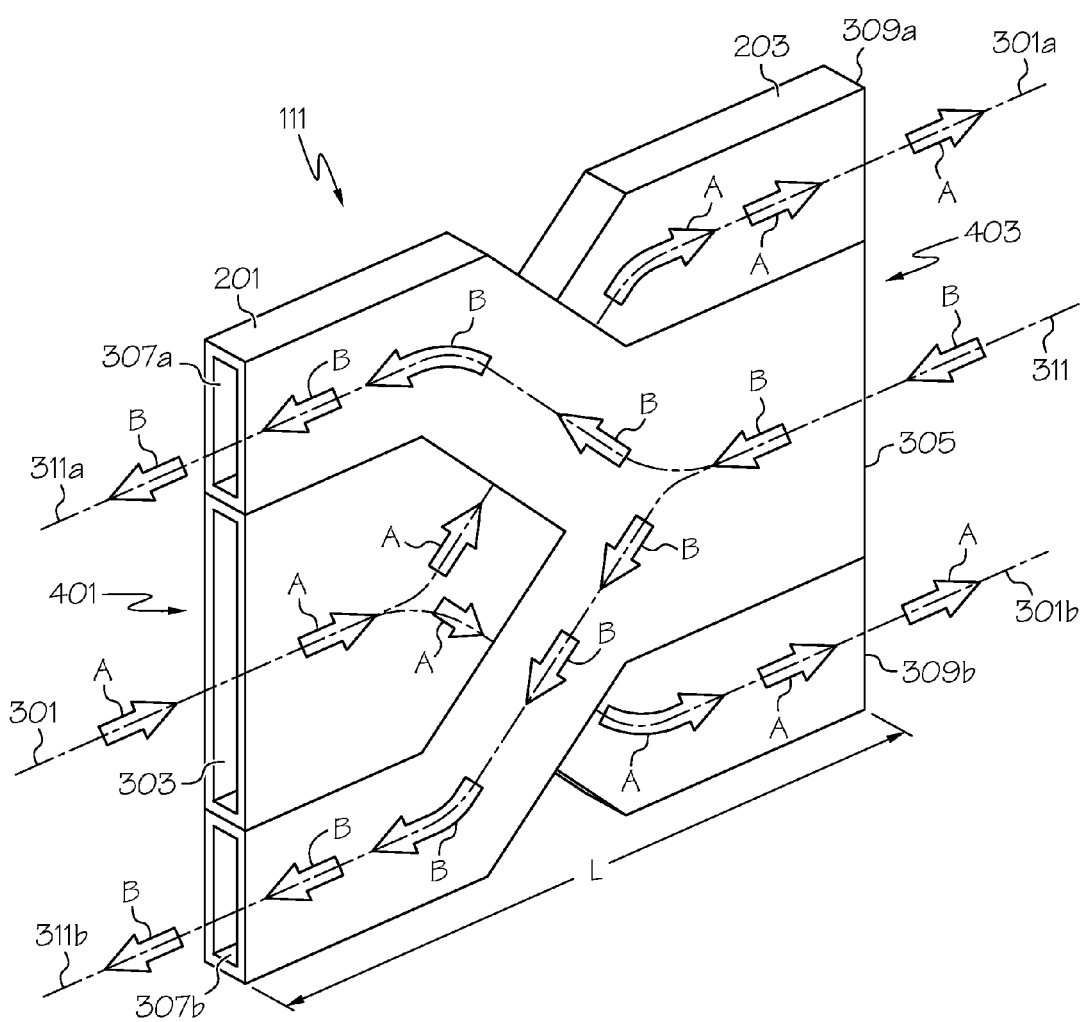
FIG. 3 is a perspective view of one example fluid conduit of the circuit module apparatus of FIG. 1.

As shown in FIG. 3, the fluid conduit 111 can optionally be configured for bi-directional cooling wherein fluid flow can be provided with bi-directional fluid coolant paths between the first side 107 and the second side 109 of the housing 105. For instance, the example fluid conduit 111 provides a first fluid coolant path 301, 301a, 301b between the first side 107 and the second side 109 of the housing 105. As represented by the arrows designated "A" in FIG. 3, a first fluid coolant may pass along the first fluid coolant path 301, 301a, 301b in a direction from the first side 107 to the second side 109 of the housing. The example fluid conduit 111 can further provide a second fluid coolant path 311, 311a, 311b between the first side 107 and the second side 109 of the housing 105. As represented by the arrows designated "B" in FIG. 3, a second fluid coolant may pass along the second fluid coolant path 311, 311a, 311b in a direction from the second side 109 to the first side 107 of the housing 105.

As further illustrated in FIG. 3, in one example of a fluid conduit providing bi-directional fluid coolant paths, the first end portion 201 of the fluid conduit 111 can include a first inlet port 303 for the first fluid coolant and the second end portion 203 of the fluid conduit 111 can include a second inlet port 305 for the second fluid coolant. The second end portion 203 of the fluid conduit 111 includes a first outlet port, for example, that may be optionally split into separate portions. For instance, as shown in FIG. 3, the first outlet port includes a first portion 309a and a second portion 309b. Likewise, the first end portion 201 can include a second outlet port, for example, that may also be optionally split into separate portions. For instance, as also shown in FIG. 3, the second outlet port includes a first portion 307a and a second portion 307b. Splitting the first and second outlet port can provide one example configuration that allows the fluid conduit 111 to include a first fluid conduit 401 and a second fluid conduit 403 (see FIG. 4) that can be nested together as shown in FIG. 3.

Figure 4:
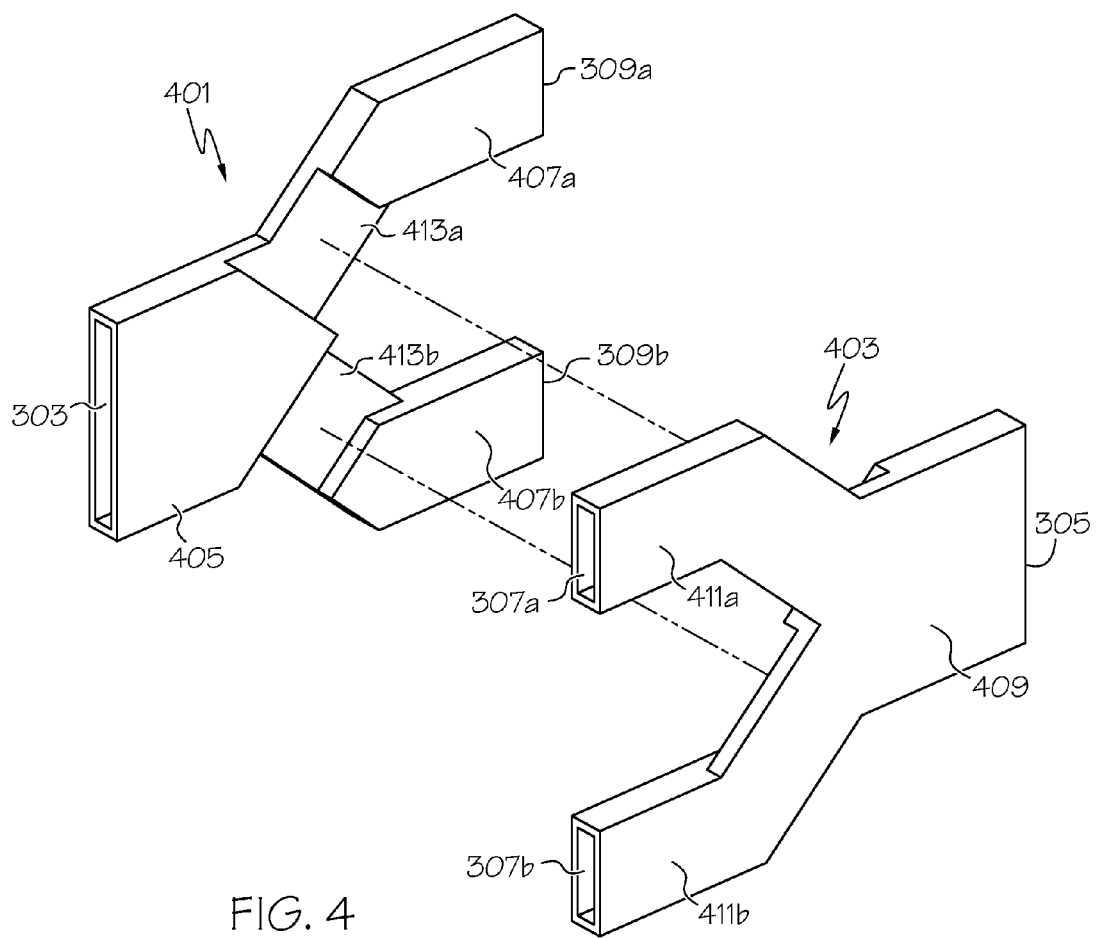
FIG. 4 is an exploded view of the fluid conduit of FIG. 3.

With reference to FIG. 4, the first fluid conduit 401 can comprise a Y-shaped conduit including an inlet branch 405 including the first inlet port 303 and two outlet branches 407a, 407b that respectively include the first and second portions 309a, 309b of the first outlet port. The second fluid conduit 403 can also comprise a similar Y-shaped conduit with an inlet branch 409 including the second inlet port 305 and two outlet branches 411a, 411b that respectively include the first and second portions 307a, 307b of the second outlet port. The outlet branches each fluid conduit can include recessed portions 413a, 413b configured to receive a portion of the outlet branches of the other fluid conduit when the fluid conduits 401, 403 are nested together as shown in FIG. 3.

With reference to FIG. 4, the first fluid conduit 401 can be nested with the second fluid conduit 403 by inverting the Y-shaped conduits and aligning the conduits such that the recessed portions 413a, 413b of each conduit face one another. Next, the fluid conduits 401, 403 are nested together as shown in FIG. 3, wherein the inlet branch 405 of the first conduit 401 is straddled by the outlet branches 411a, 411b of the second conduit 403 while the inlet branch 409 of the second conduit 403 is straddled by the outlet branches 407a, 407b of the first conduit 401. Providing the first conduit 401 being nested with the second conduit 403 can provide a compact design permitting a reduced cooling footprint area while allowing bidirectional cooling from separate fluid coolant streams. Moreover, providing bi-directional cooling can permit relatively favorable cooling at both ends of the fluid conduit when compared to uni-directional cooling. Indeed, the first fluid coolant is designed to enter the first inlet port 303 at a lower temperature than the first fluid coolant exiting the second fluid port of the first conduit 401. Likewise, the second fluid coolant is designed to enter the second inlet port 305 at a lower temperature than the second fluid coolant exiting the second fluid port of the second conduit 403. Fluid conduits throughout the disclosure can be fabricated by injection molding, 3D printing, extrusion or other fabrication techniques. For instance, the fluid conduits 401, 403 may be fabricated by 3D printing of fluid using, for example, laser sintering or other 3D printing techniques.

As such, enhanced fluid cooling can be achieved at the first end portion 201 of the fluid conduit 111 with the first cooling fluid while enhanced fluid cooling can also be achieved at the second end portion 203 of the fluid conduit 111 with the second cooling fluid. FIG. 1 illustrates a potential arrangement of a plurality of the fluid conduits 111 arranged to be spaced apart from one another along an axis of the housing 105. In the illustrated example, the first side 107 can include elongated openings 121 aligned with elongated openings 123 in the second side 109. The elongated openings 121 in the first side 107 are configured to receive the first end portion 201 of the fluid conduits while the elongated openings 123 in the second side 109 are configured to receive the second end portion 203. Optionally, as shown in FIG. 2, the end edges 201a of the first end portion 201 can be flush with respect to the outer surface 205 of the first side 107 of the housing while the end edges 203a of the second end portion 203 can be flush with respect to the outer surface 207 of the second side 109 of the housing.

As further illustrated in FIG. 1 a first U-shaped conduit 127 may be mounted with respect to the first side 107 with opposed walls 129a, 129b extending across respective intermediate portions 125a, 125b of the first end portions 201 of the fluid conduits 111 to place the first inlet ports 303 in fluid communication with one another. A second U-shaped conduit 131 can also be mounted with respect to the second side 109 with opposed walls 133a, 133b that likewise extends across respective intermediate portions of the second end portions 203 of the fluid conduits to place the second inlet ports 305 in fluid communication with one another.

In operation, a first fluid coolant stream 135 can enter an inlet of the first U-shaped conduit 127. The first fluid coolant stream 135 is then divided such that portions enter respective first inlets 303 of the fluid conduits 111. The fluid is then further divided to exit portions 309a, 309b of the first outlet port to be discharged above and below the second U-shaped conduit 131. Furthermore, a second fluid coolant stream 137 can enter an inlet of the second U-shaped conduit 131. The second fluid coolant stream 137 is then divided such that portions enter respective second inlets 305 of the fluid conduits 111. The fluid is then further divided to second portions 307a, 307b of the second outlet port to be discharged above and below the first U-shaped conduit 127.

Figure 5:
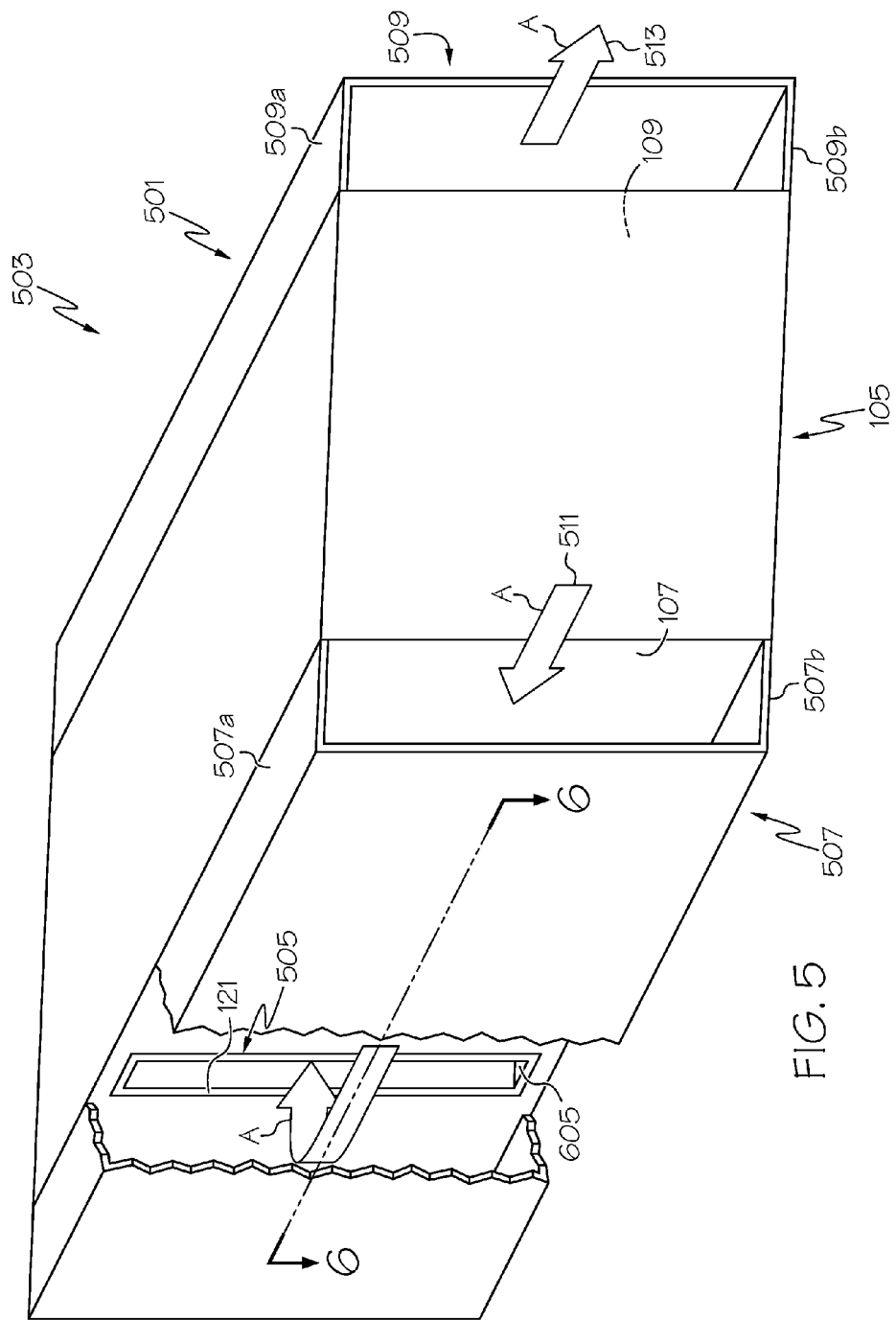
FIG. 5 is a perspective view of another example circuit module apparatus.

FIG. 5 illustrates another example of a fluid cooled enclosure 501 for a circuit module apparatus 503. In one example, the fluid cooled enclosure 501 can include the housing 105 discussed above although other configurations may be used in further examples.

Figure 6:
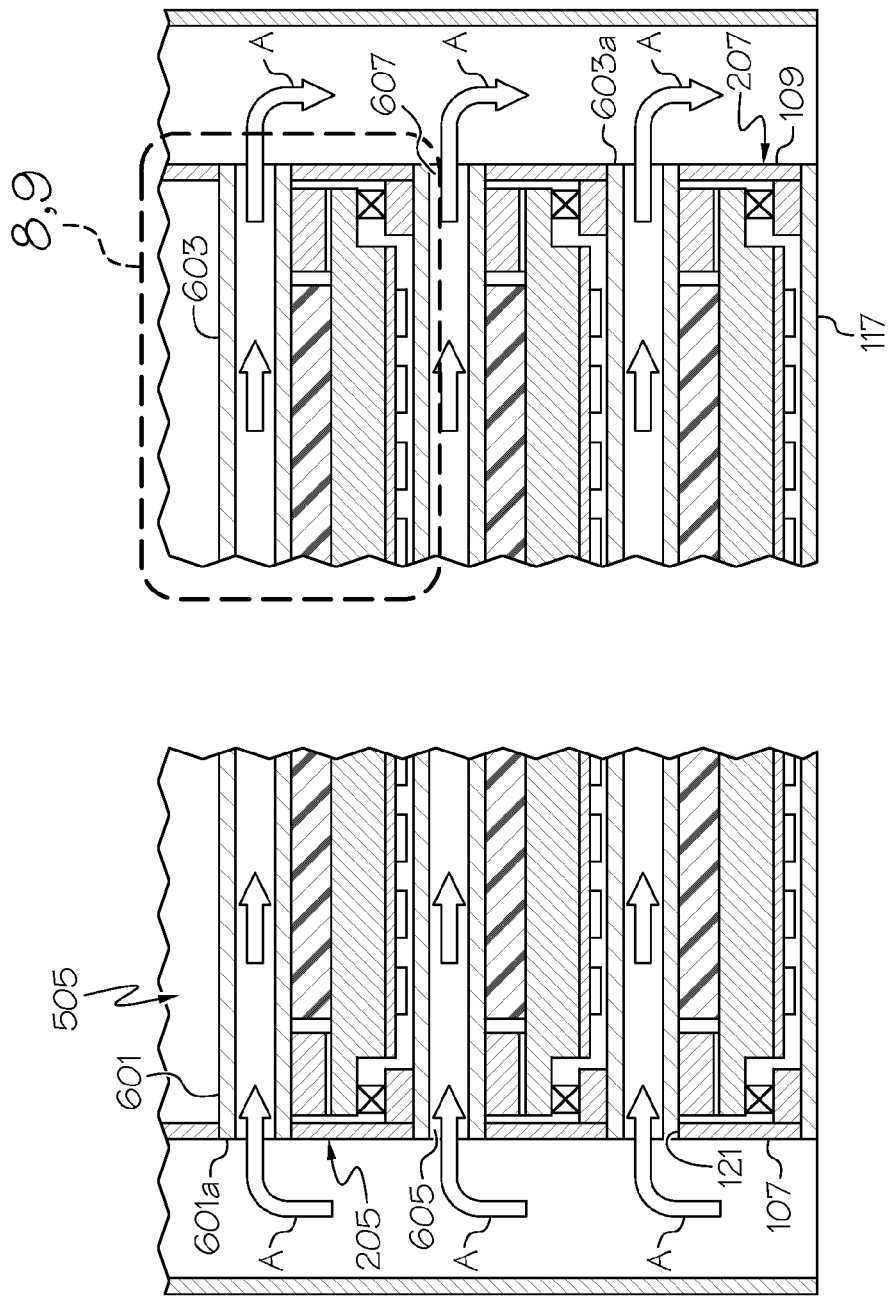
FIG. 6 is a partial schematic cross section of the circuit module apparatus along line 6-6 of FIG. 5.

The fluid cooled enclosure 501 further includes a plurality of fluid conduits 505 although a single fluid conduit may be provided in further examples. As shown, each fluid conduit 505 is substantially identical with one another although fluid conduits may have different configurations in further examples. As shown in FIG. 6, the fluid conduit 505 can include a first end portion 601 positioned at the first side 107 comprising the first lateral side of the housing 105 and a second end portion 603 positioned at the second side 109 comprising the second lateral side of the housing 105.

FIG. 5 illustrates a potential arrangement of a plurality of the fluid conduits 505 arranged to be spaced apart from one another along the axis of the housing 105. In the illustrated example, the elongated openings 121 in the first side 107 are configured to receive the first end portion 601 of the fluid conduits 505 while the elongated openings 123 in the second side 109 are configured to receive the second end portion 603. Optionally, as shown in FIG. 6, end edges 601a of the first end portion 201 can be flush with respect to the outer surface 205 of the first side 107 of the housing while end edges 203a of the second end portion 603 can be flush with respect to the outer surface 207 of the second side 109 of the housing 105.

Figure 7:
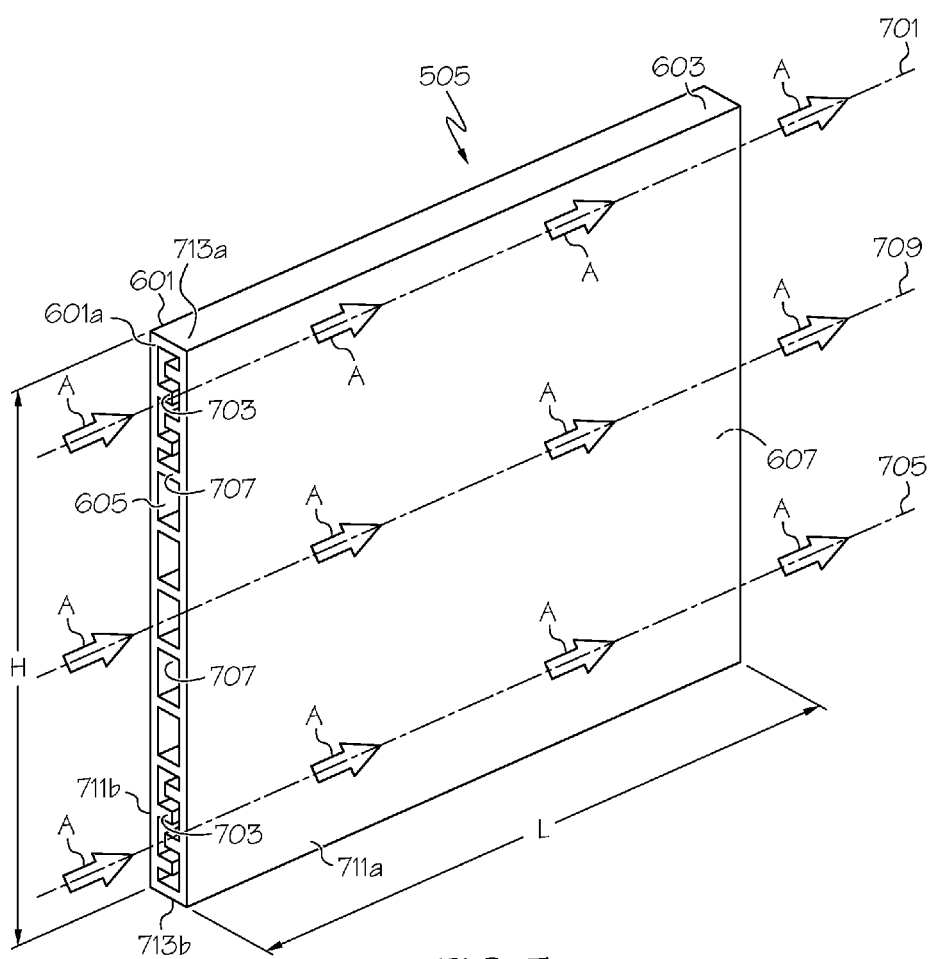
FIG. 7 is a perspective view of one example fluid conduit of the circuit module apparatus of FIG. 5.

As shown in FIG. 7, the fluid conduit 505 can optionally be configured for uni-directional cooling wherein fluid flow can be provided with one or more uni-directional fluid coolant paths between the first side 107 and the second side 109 of the housing 105. For instance, the example fluid conduit 505 provides a first fluid coolant path 701 between the first side 107 and the second side 109 of the housing 105. As represented by the arrows designated "A" in FIG. 3, a first fluid coolant may pass along the first fluid coolant path 701 in a direction from the first side 107 to the second side 109 of the housing. In one example, the fluid conduit 505 includes a single fluid path. The single fluid path may be provided with one or more optional fins 703 that may extend partially or entirely across the entire length "L" of the fluid conduit 505. The fins 703, if provided, can help facilitate convection heat transfer from the walls of the fluid conduit 505 to the first fluid coolant stream. Although not shown, the walls may be substantially free from fins which may be desired to simplify the fluid conduit 505 while maintaining sufficient heat transfer in some applications. As further illustrated in FIG. 7, the fluid conduit 505 may include a second fluid coolant path 705 that may be isolated from the first fluid coolant path 701 by way of partition walls 707 that extend partially, or entirely, along the length "L" of the fluid conduit 505. Isolating the fluid coolant paths may be desired to help control cooling at different portions along the height "H" of the fluid conduit 505. In further examples, a plurality of additional fluid coolant paths 709 may also be defined, for example, by way of the partition walls 707. As shown, the additional fluid coolant paths 709 may be defined by the partition walls 707 without free-ended fins extending within the fluid coolant paths 709. In such examples, the partition walls 707 may be spaced close enough together to help facilitate conduction heat transfer from the major walls of the fluid conduit to the fluid stream. Moreover, in such examples, the partition walls 707 may substantially increase the structural strength and rigidity of the fluid conduit 505.

Although not shown, a single fluid coolant path may be provided including any of the features discussed above. For example, the fluid conduit may be designed with a single fluid coolant path defined by the two major walls 711a, 711b and the two end walls 713a, 713b. The single fluid coolant path may optionally include one or more of the fins 703 although the inner surfaces of the major walls and end walls may be provided without fins in further examples. Still further, the fluid conduit may be provided entirely by the plurality of fluid coolant paths defined by the partition walls 707. In such examples, the fluid conduit can provide the above-referenced uni-directional cooling. Unidirectional cooling can simplify the fluid conduit design while providing sufficient heat transfer capabilities depending on the particular application. Moreover, unidirectional cooling may be easily achieved by inexpensively forming the fluid conduit 505 by an extrusion process wherein the extruded conduit is provided with a substantially constant cross-sectional extruded shape. For example, as shown in FIG. 7, the cross sectional shape illustrated at the first end portion 601 of the fluid conduit 505 extends continuously along the entire length "L" of the fluid conduit 505 such that the cross-sectional extruded shape illustrated at the first end portion 601 shown in FIG. 7 exists at every cross section taken parallel to end edges 601a of the first end portion 601. As such, providing the fluid conduit 505 as the illustrated extruded fluid conduit with a substantially constant cross sectional extruded shape can reduce the cost of producing the fluid conduit 505 and costs of installing the fluid conduit to the housing while still providing sufficient cooling capacity.

As further illustrated in FIG. 5 a first U-shaped conduit 507 may be mounted with respect to the first side 107 with opposed walls 507a, 507b extending to the first side 107 of the housing 105 to place inlet ports 605 of the fluid conduits 505 in fluid communication with one another. A second U-shaped conduit 509 can also be mounted with respect to the second side 109 with opposed walls 509a, 509b that likewise extend to the second side 109 of the housing 105 to place outlet ports 607 of the second end portions 603 of the fluid conduits to place outlet ports 607 of the fluid conduits 505 in fluid communication with one another.

In operation, as shown in FIG. 5, a first fluid coolant stream 511 can enter an inlet of the first U-shaped conduit 507. The first fluid coolant stream 511 is then divided such that portions enter respective first inlets 605 of the fluid conduits 505. The fluid then travels to outlet ports 607 to be received in the second U-shaped conduit 509 and carried away as fluid stream 513 exiting the fluid conduit.

Figure 8:
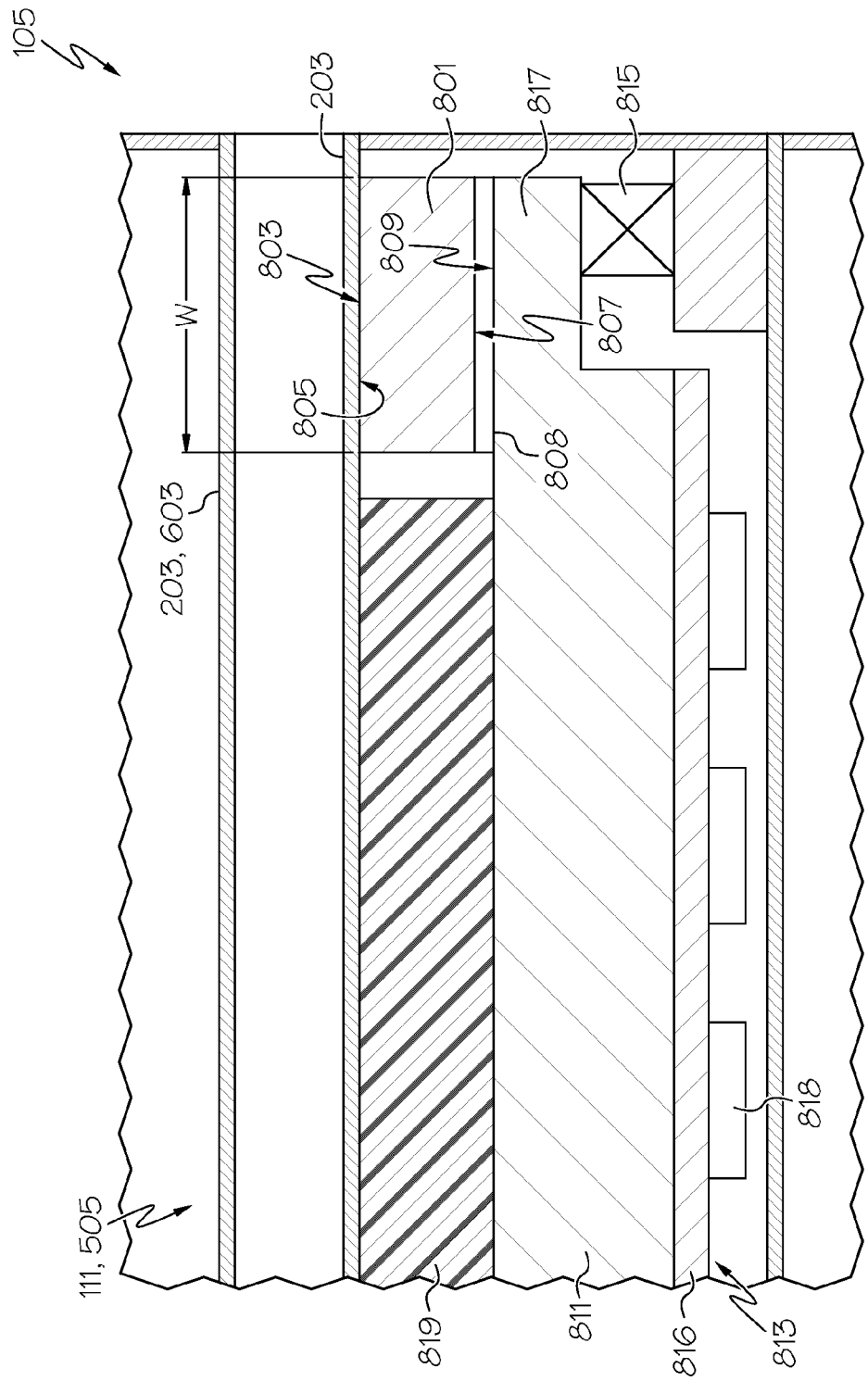
FIG. 8 is an enlarged view of an example interface configuration of the circuit module apparatus taken at view 8 of FIGS. 2 and 6.
Figure 9:
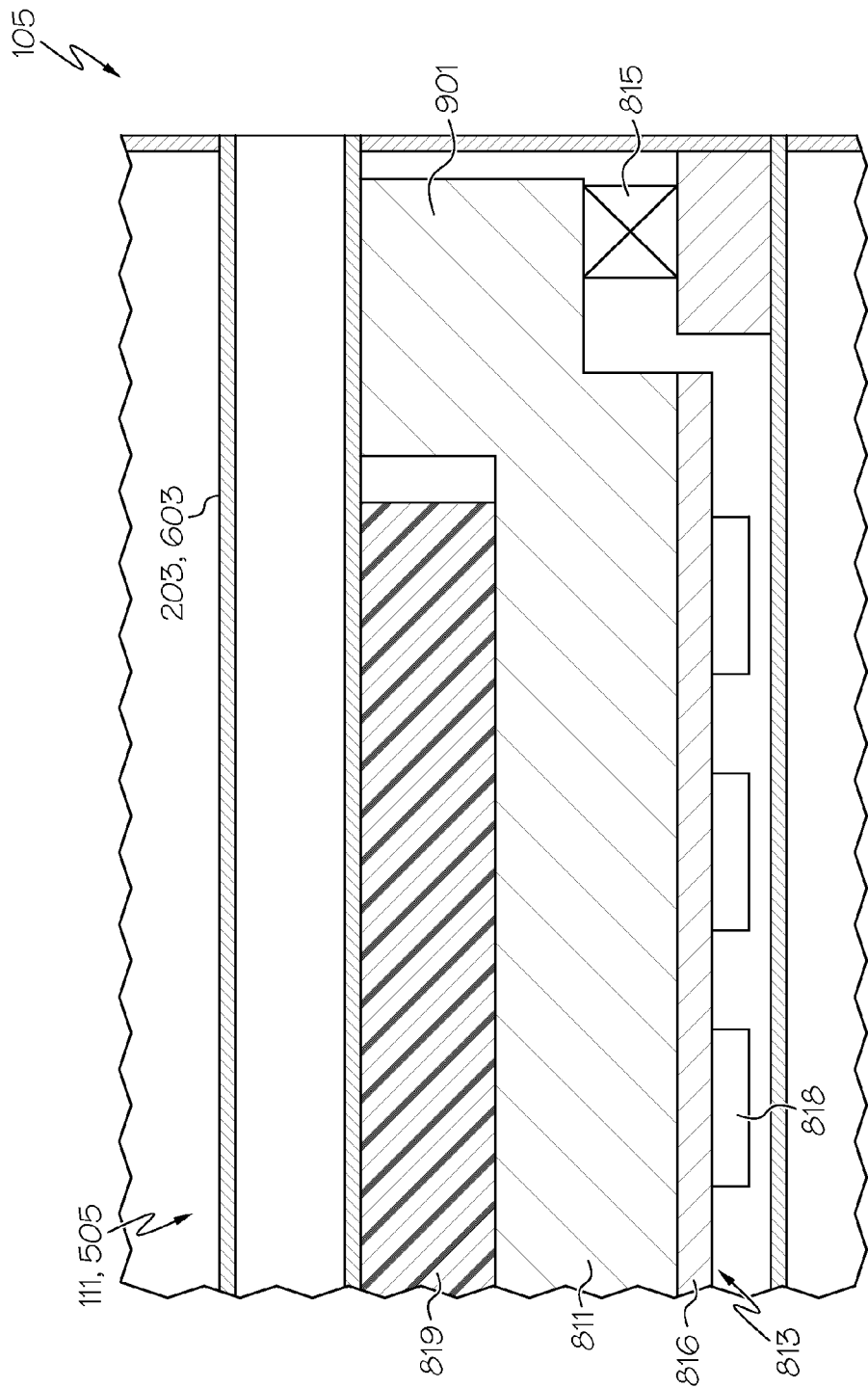
FIG. 9 is an enlarged view of portions of another example interface configuration of the circuit module apparatus taken at view 9 of FIGS. 2 and 6.

The fluid cooled enclosure 101, 501 further includes at least one interface block configured to be mounted with respect to the housing. FIGS. 8 and 9 illustrate example interface blocks 801, 901 that may be used in accordance with aspects of the disclosure with the understanding that alternative interface blocks may be provided in further examples. Moreover, features of the example interface blocks 801, 901 are shown with respect to the second end portions 203, 603 with the understanding that similar or identical interface blocks may be provided at the first end portions 201, 601. Indeed, as referenced by representative dashed lines in FIGS. 2 and 6, the end configuration associated with the first end portion 201 may comprise a mirror image of the end configurations of the second end portions 203, 603. As such, a detailed discussion of the interface blocks 801, 901 will be described with reference to the second end portions 203, 603 with the understanding that a similar or identical mirror image configuration may be provided at the first end portions 201, 601.

As shown in FIG. 8, one example interface block 801 is mounted with respect to the housing 105 such that a first interface surface 803 of the interface block 801 engages an interface surface 805 of the first end portion 201 of the fluid conduit 111. In one example, the first interface surface 803 very closely matches the interface surface 805 of the fluid conduit 111 to provide excellent conductive heat transfer therebetween. For instance, the first interface surface 803 can be machined to be extremely flat or may be nickel plated or otherwise processed to be extremely flat. The first interface surface 803 can be provided with a flat surface having a reduced surface roughness (Ra), for example, from about 0.2 μm to about 1.5 μm to reduce or eliminate potential air gaps between the first interface surface 803 and the interface surface 805. In one example, the surface roughness can be selected as a heat transfer characteristic to provide the desired heat transfer efficiency for the particular cooling application. For instance, the surface roughness can be left relatively rough to reduce costs associate with machining, coating or other processing techniques while still providing a desired cooling capacity. In further examples, the surface roughness can be reduced to enhance heat transfer in applications where a higher cooling capacity is desired.

In another example, first end portion 201, 601 (and/or second end portion 203, 603) of the fluid conduit 111, 505 may be fabricated with a first material composition and the interface block 801 may be fabricated with a second material composition that has a higher thermal conductivity than the first material composition although the thermal conductivity may be substantially the same in further examples. In some examples, the second material composition of the interface block 801 can have a thermal conductivity that is greater than or equal to 200 W/m·K. For example, the first material composition of the fluid conduit can comprise aluminum with a thermal conductivity of 180 W/m·K while the second material composition of the interface block 801 can comprise copper with a thermal conductivity of 400 W/m·K or a composite material with a thermal conductivity of from about 600 W/m·K to about 2000 W/m·K. In one example, a composite material may comprise a carbon fiber matrix fused with aluminum or copper although other composite materials may be provided in further examples. As such, the interface block 801 may be fabricated from a material that is preselected to provide the desired heat transfer characteristic by adjusting the thermal conductivity of the interface block 801. A higher heat transfer conductivity for the second material of the interface block may be selected to accommodate high power applications requiring enhanced thermal conductivity while a lower heat transfer conductivity for the second material of the interface block may be selected to accommodate lower power applications.

The interface block 801 may have a width "W" that is substantially less than the length "L" of the fluid conduit. The width can be maximized to provide enhanced heat transfer while being reduced to the extent necessary to maintain the desired bearing pressure of the first interface surface 803 against the interface surface 805. At the same time, the length of the interface block 801 can be selected to extend along a substantial portion or the entire height "H" of the fluid conduit. The width "W" of the interface block 801 can be selected to provide the desired clamping pressure selected for the particular application and can range, for example, from about 0.1 MPa to about 8 MPa, such as from about 0.5 MPa to about 2 MPa, such as from about 0.1 MPa to about 1 MPa. As such, the width of the interface block 801 may be preselected to provide the desired heat transfer characteristic by adjusting the contact bearing pressure of the interface block against the fluid conduit.

The interface block 801 can further include a second interface surface 807 configured to interface with a surface 809 of a conduction member 811 of a conduction cooled circuit module 813. As shown, the first interface surface 803 and the second interface 807 surface of the interface block 801 face away from one another and, in some examples, the first interface surface 803 is substantially parallel to the second interface surface 807 of the interface block. Providing the interface block with substantially parallel surfaces can be effective to accommodate a conduction member 811 comprising a conduction plate wherein the surface 809 is substantially flat and extends along a plane. As such, both ends of the conduction plate may more effectively abut corresponding second interface surfaces 807 of respective interface blocks 801 mounted at the first end portion and the second end portion of the fluid conduits 111, 505.

In order to enhance the interface to facilitate conduction heat transfer between the second interface surface 807 of the interface block 801 and the surface 809 of the conduction member 811, an optional layer of thermal interface material (TIM) 808 may be provided. The material may comprise a phase change material configured to fill interstitial voids during an initial heat cycle that operates to integrate the second interface surface 807 with the surface 809 of the conduction member 811. As such, providing a desired level of thermal conductivity at the interface between the conduction member 811 of the conduction cooled circuit module 813 and the interface block 801 can be preselected to provide the desired heat transfer characteristic. In the illustrated example, the interface block 801 is mounted to the conduction member 811 of a conduction cooled circuit module 813 which is then in turn mounted to the housing. As such, the interface block 801 is configured to be mounted with respect to the housing indirectly by way of the circuit module 813. Such a configuration may be beneficial to allow a circuit module to be easily removed from the housing and replaced with another module possibly having a different interface block configuration to address a unique power requirement of the circuit module 813. In further examples, the interface block 801 may optionally be configured to be mounted with respect to the housing by being directly mounted to the housing.

FIGS. 8 and 9 each show examples wherein the interface block 801, 901 is not integral with the first or second end portion of the fluid conduits. Providing the interface blocks that are separate from the end portions of the fluid conduits can allow formation of the fluid conduits by way of an extrusion process wherein the extruded conduit is provided with a substantially constant cross-sectional extruded shape. As shown, the interface block 901 may optionally be integral with the conduction member 811 of the conduction cooled circuit module 813. Providing an integral interface block 901 may be desired to reduce the number of parts. FIG. 8 illustrates examples where the interface block 801 is not integral with the conduction member 811. Providing a separate interface block 801 that is later integrated with the surface 809 of the conduction member 811 can allow retrofitting of various existing conduction cooled circuit modules 813 with conduction members 811 comprising substantially flat plates. Moreover, providing separate interface blocks 801 can allow tuning of the enclosure to tailor the enclosure to accommodate a particular conduction cooled circuit module with power requirements for the electronics on the circuit boards of the circuit modules.

The enclosure can optionally comprise a biasing member 815 configured to bias a portion 817 of a conduction member 811 of a conduction cooled circuit module 813 against the interface block 801 such that the interface block is compressed between the first end portion 201 of the fluid conduit and the portion 817 of the conduction member 811 of the conduction cooled circuit module 813. In one example, the biasing member 815 can comprise a wedgelock expander although captive fasteners with springs or other biasing devices may be provided in further examples. The biasing member 815 can be designed to apply a predetermined force to the allow the interface block to apply the desired bearing pressure against the fluid conduit sufficiently reduce resistance to heat transfer from the conduction member 811 to the fluid conduit.

Methods of cooling the conduction cooled circuit module 831 will be described. The conduction cooled circuit module 831 includes a circuit board 816 with electrical components 818, such as central processing units, or other electrical components mounted on the circuit board 816. The conduction member 811, such as the illustrated conduction plate may be mounted to the circuit board such that heat from the electrical components may freely travel to the conduction member 811. The conduction member may comprise metal or composites that facilitate conduction of heat away from the electrical components 818. As apparent in FIGS. 2 and 6, the conduction member 811 may span a substantial portion of the length "L" of the fluid conduit, such as substantially the entire length "L" to maximize heat transfer from the conduction member 811 to the fluid conduit.

The method can include the step of providing the fluid cooled enclosure 101, 501 with the fluid conduit 111, 505. The interface block 801 can be mounted to the conduction cooled circuit module 813 such that a portion of a conduction member 811 of the conduction cooled module 813 engages the second interface surface 807 of the interface block 801. The method can then include the step of mounting the interface block 801 with respect to the fluid conduit 111, 505 such that the first interface surface 803 of the interface block 801 engages an interface surface 805 of the fluid conduit 111, 505. In one example, the interface block may be mounted to the conduction cooled circuit module prior to mounting the interface block with respect to the fluid conduit. In further examples, the interface block may be mounted with respect to the fluid conduit prior to mounting the interface block to the conduction cooled circuit module.

The method can further include the step of cooling electrical circuits of the conduction cooled circuit module 813 by flowing fluid coolant through the fluid conduit, wherein heat is transferred from the electrical circuits, through the conduction member, through the interface block and carried away by the fluid coolant. In one example, the method can comprise the step of selecting an interface block including a desired heat transfer characteristic for mounting the interface block with respect to the fluid conduit. For example, an interface block may include a desired surface roughness for the first interface surface 803, a desired width "W", a desired material composition used to fabricate the interface block or other characteristics wherein the thermal resistance provided by the interface block may be dialed in to a particular thermal cooling configuration.

As such, heat transfer characteristics of the interface blocks may be tailored to accommodate the particular conduction cooled circuit module 813. Lower power modules may require lower conductivity and may therefore select interface blocks comprising materials with a relatively low thermal conductivity (e.g., aluminum), comprise interface blocks with relatively small widths "W" or relatively rough interface surfaces. Higher power modules may also be handled by providing the enclosure with a relatively high conductivity by selecting an interface block comprising materials with a relatively high thermal conductivity (e.g., copper, composite materials with high conductivity), interface blocks that have relatively wide widths "W" with sufficient bearing pressure, or relatively smooth interface surfaces.

Fluid cooled enclosure may accommodate fluid coolant sources such as air (or other gas), liquid, or vapor to cool 200 W+ systems such as conduction cooled circuit modules 813 with circuits comprising two 70 W processors or other relatively high power electrical components. The fluid cooled enclosure of the present disclosure can provide a relatively rugged design to accommodate a wide range of conduction cooled circuit modules having different cooling requirements. Example embodiments can include the fluid conduit 505 that may be extruded with little or no post-machining of the exterior surfaces. Such fluid conduits 505 may be provided with a constant cross-sectional size and shape along the length to provide relatively inexpensive production of fluid conduits for fabricating the fluid cooled enclosure.

Example embodiments further include fluid cooled enclosure that provide the housing 105 with openings 121 that may receive the end portions of the fluid conduits and bond the end portions to provide a fluid tight seal to prevent leakage of the fluid coolant into the interior of the housing outside the fluid conduit.

Example embodiments further optionally provide a fluid conduit 111 configured for bi-directional cooling arrangement that can provide superior cooling when compared to uni-directional designs. Moreover, the bi-directional cooling arrangement can allow high powered circuit components to be located near the card edges corresponding to the end portions 201, 203 of the fluid conduit 111. As such, both card edges can provide superior cooling efficiency when compared to uni-directional designs that may only provide superior cooling at one edge of the conduction cooled circuit module.

Moreover, as discussed previously, the interface blocks can be attached to the card edges to allow tailoring of the thermal resistance between the circuit module edges and the fluid conduit. As mentioned previously, the width "W" of the interface block can be selected depending on the power of the modules and therefore the amount of cooling needed. Wider blocks will involve a larger surface area and may therefore be used to accommodate higher power configurations while narrower blocks can be used with lower power modules. Materials having higher thermal conductivity may be used to fabricate the interface blocks in applications with high power requirements while lower thermal conductivity may be used to fabricate interface blocks in applications with lower power requirements. High conductivity composites with a thermal conductivity of greater than 400 W/m·K, copper (about 400 W/m·K) or aluminum (about 200 W/m·K) may optionally be used to fabricate the interface blocks depending on the desired cooling requirements of the particular application. Still further, the surface finish of the interface blocks may be tailored to the circuit module power. Finishes with low thermal contact resistance (e.g., nickel plating) may be used for higher power modules, whereas other finishes like anodizing and chemical conversion may be used for lower power modules.

Still further, the layer of thermal interface material (TIM) 808 may be used to facilitate alignment of the contact surface of the interface block while reducing thermal contact resistance between the conduction member 811 and the interface block.

Still further a resilient heat transfer member 819 may be provided to facilitate heat transfer between central portions of the conduction member 811 and the fluid conduit. The resilient heat transfer member 819 is designed to provide a bridge between the space that may otherwise exist between the back surface of the conduction member and the fluid conduit without contributing substantially to the bearing stress against the fluid conduit. As such, pressure may be maintained between the first interface surface 803 of the interface block 801 and the interface surface 805 of the fluid conduit.

It will be apparent to those skilled in the art that various modifications and variations can be made to the described embodiments without departing from the spirit and scope of the claimed invention. Thus, it is intended that the present claimed invention cover the modifications and variations of the embodiments described herein provided they come within the scope of the appended claims and their equivalents.

What is claimed is:

1. A fluid cooled enclosure for a circuit module apparatus comprising:
   a housing with a first side and a second side;
   a circuit board, including electrical components mounted on the circuit board, located within the housing and comprising a heat conduction plate;
   a fluid conduit including a first end portion positioned at the first side of the housing and a second end portion positioned at the second side of the housing, wherein the fluid conduit provides a fluid coolant path along the length of the fluid conduit between the first side and the second side of the housing;
   a first interface block mounted along the first end portion of the fluid conduit and with respect to the housing such that a first interface surface of the first interface block is mounted on, and separated from the fluid coolant path by an interface surface of the housing that defines a region of the fluid coolant path adjacent to the first end portion of the fluid conduit;

a second interface block mounted along the second end portion of the fluid conduit and with respect to the housing such that a first interface surface of the second interface block is mounted on, and separated from the fluid coolant path by an interface surface of the housing that defines a region of the fluid coolant path adjacent to the second end portion of the fluid conduit; and a first biasing member biasing a first portion of the heat conduction plate toward the first interface block such that the first interface block is compressed against the first end portion of the fluid conduit;

a second biasing member biasing a second portion of the heat conduction plate toward the second interface block such that the second interface block is compressed against the second end portion of the fluid conduit;

wherein the first and second interface blocks are located between the heat conduction plate and the fluid conduit and transfer heat from the circuit board to the fluid conduit, and respective widths of the first and second interface blocks are substantially less than the length of the fluid conduit along the fluid coolant path.

2. The enclosure of claim 1, wherein the interface blocks include a second interface surface in contact with a surface of the heat conduction plate.

3. The enclosure of claim 2, wherein the first interface surface and the second interface surface of the interface blocks face away from one another.

4. The enclosure of claim 3, wherein the first interface surface is substantially parallel to the second interface surface of the interface blocks.

5. The enclosure of claim 1, wherein the first end portion of the fluid conduit is fabricated with a first material composition and the interface blocks are fabricated with a second material composition that has a higher thermal conductivity than the first material composition.

6. The enclosure of claim 1, wherein the fluid conduit comprises an extruded fluid conduit with a substantially constant cross sectional extruded shape.

7. The enclosure of claim 1, wherein the fluid conduit comprises nested Y-shaped portions that provide bi-directional coolant flow along said conduit, wherein the first end portion of the fluid conduit includes a first inlet port for a first fluid coolant and the second end portion of the fluid conduit includes a second inlet port for a second fluid coolant.

8. The enclosure of claim 7, wherein the first end portion of the fluid conduit includes a second outlet port for the second fluid coolant and the second end portion of the fluid conduit includes a first outlet for the first fluid coolant.

9. The enclosure of claim 1, wherein the fluid conduit includes a first fluid conduit for a first fluid coolant and a second fluid conduit for the second fluid coolant.

10. The enclosure of claim 9, wherein the first fluid conduit is nested with the second fluid conduit.

11. The enclosure of claim 1, wherein the interface blocks are integral with the heat conduction plate.

12. A fluid cooled enclosure for a circuit module apparatus comprising:

a housing with a first side and a second side;

a circuit board, including electrical components mounted on the circuit board, located within the housing and comprising a heat conduction plate;

a fluid conduit arrangement that bi-directionally cools the housing, wherein the fluid conduit arrangement includes a first end portion positioned at the first side of the housing and a second end portion positioned at the second side of the housing, wherein the fluid conduit arrangement provides a plurality of non-linear bi-directional fluid coolant paths along the length of the fluid conduit arrangement between the first side and the second side of the housing;

a first interface block mounted along the first end portion of the fluid conduit arrangement and with respect to the housing such that a first interface surface of the first interface block is mounted on, and separated from the fluid coolant path by an interface surface of the housing that defines a region of the fluid coolant path adjacent to the first end portion of the fluid conduit arrangement;

a second interface block mounted along the second end portion of the fluid conduit arrangement and with respect to the housing such that a first interface surface of the second interface block is mounted on, and separated from the fluid coolant path by an interface surface of the housing that defines a region of the fluid coolant path adjacent to the second end portion of the fluid conduit arrangement; and a first biasing member biasing a first portion of the heat conduction plate toward the first interface block such that the first interface block is compressed against the first end portion of the fluid conduit arrangement;

a second biasing member biasing a second portion of the heat conduction plate toward the second interface block such that the second interface block is compressed against the second end portion of the fluid conduit arrangement;

wherein the first and second interface blocks are located between the heat conduction plate and the fluid conduit arrangement and transfer heat from the circuit board to the fluid conduit arrangement, and respective widths of the first and second interface blocks are substantially less than the length of the fluid conduit arrangement along the fluid coolant path.

13. The enclosure of claim 12, wherein the first end portion of the fluid conduit arrangement includes a first inlet port for a first fluid coolant and the second end portion of the fluid conduit arrangement includes a second inlet port for a second fluid coolant.

14. The enclosure of claim 13, wherein the second end portion of the fluid conduit arrangement includes a first outlet for the first fluid coolant and the first end portion of the fluid conduit arrangement includes a second outlet port for the second fluid coolant.

15. The enclosure of claim 12, wherein the fluid conduit arrangement includes a first fluid conduit for a first fluid coolant and a second fluid conduit for the second fluid coolant, and the first and second fluid conduits are isolated from each other between the first and second end portions.

16. The enclosure of claim 15, wherein the first fluid conduit is nested with the second fluid conduit.

17. The enclosure of claim 12, wherein the first interface block and the second interface block are integral with the heat conduction plate.

* * * * *